United States Patent
Cao et al.

(10) Patent No.: US 7,679,111 B2
(45) Date of Patent: Mar. 16, 2010

(54) TERMINATION STRUCTURE FOR A POWER SEMICONDUCTOR DEVICE

(75) Inventors: Jianjun Cao, Torrance, CA (US);
Nazanin Amani, Long Beach, CA (US);
Daniel M. Kinzer, El Segundo, CA (US)

(73) Assignee: International Rectifier Corporation, El Segundo, CA (US)

( * ) Notice: Subject to any disclaimer, the term of this patent is extended or adjusted under 35 U.S.C. 154(b) by 285 days.

(21) Appl. No.: 11/521,100

(22) Filed: Sep. 14, 2006

(65) Prior Publication Data
US 2007/0085111 A1    Apr. 19, 2007

Related U.S. Application Data

(60) Provisional application No. 60/717,842, filed on Sep. 16, 2005.

(51) Int. Cl.
*H01L 29/80* (2006.01)
(52) U.S. Cl. .................................................... 257/287
(58) Field of Classification Search .............. 257/341, 257/355, 630, 487, 488, 490, 491, 494, 495, 257/496, 339, 342, 287
See application file for complete search history.

(56) References Cited

U.S. PATENT DOCUMENTS

| | | | |
|---|---|---|---|
| 5,880,501 A * | 3/1999 | Nagai | 257/355 |
| 6,022,790 A * | 2/2000 | Wagers et al. | 438/454 |
| 6,054,752 A | 4/2000 | Hara et al. | |
| 6,111,290 A | 8/2000 | Uenishi et al. | |
| 6,563,197 B1 * | 5/2003 | Wagers et al. | 257/630 |
| 6,667,515 B2 * | 12/2003 | Inoue | 257/341 |
| 6,825,510 B2 | 11/2004 | Probst | |
| 7,075,125 B2 * | 7/2006 | Saito et al. | 257/194 |
| 2005/0161761 A1 * | 7/2005 | Hatade | 257/487 |

OTHER PUBLICATIONS

International Search Report for Corresponding Application PCT/US06/36238 Dated Mar. 29, 2007.

* cited by examiner

*Primary Examiner*—Thao Le
(74) *Attorney, Agent, or Firm*—Farjami & Farjami LLP

(57) ABSTRACT

A power semiconductor device having a termination structure that includes a polysilicon field plate, a metallic field plate, and a polysilicon equipotential ring.

20 Claims, 3 Drawing Sheets

TERMINATION STRUCTURE FOR A POWER SEMICONDUCTOR DEVICE

RELATED APPLICATION

This application is based on and claims benefit of U.S. Provisional Application Ser. No. 60/717,842, filed on Sep. 16, 2005, entitled TERMINATION STRUCTURE, to which a claim of priority is hereby made and the disclosure of which is incorporated by reference.

BACKGROUND OF THE INVENTION

Referring to FIG. 1, a power semiconductor device according to the prior art includes a semiconductor body having an active region 12 and a termination region 14.

Active region 12 preferably includes the active cells of a power semiconductor device, such as a power MOSFET, which may include at least one PN junction. The PN junction, for example, is a portion of semiconductor body 10 (e.g. epitaxially grown silicon) that includes a base region 16 formed therein. Base region 16 is, as is well known, a diffused region of a conductivity opposite to that of semiconductor body 10. Thus, base region 16 may be P-type when semiconductor body is N-type and vice versa.

Termination region 14 surrounds active region 12, and includes field oxide body 18 formed on semiconductor body 10, first polysilicon field plate 20, oxide body 22, first metallic field plate 24 formed on oxide body 22 and extending therethrough to make electrical contact with first polysilicon field plate 20, second polysilicon field plate 26 formed over field oxide 18 and laterally spaced from first polysilicon field plate 20, second metallic field plate 28 laterally spaced from first metallic field plate 24 formed on oxide body 22 and extending therethrough to make electrical contact with second polysilicon field plate 26 formed over field oxide 18, and third metallic field plate 30 (which is preferably an extension of a power contact, e.g. source contact) disposed partially on oxide body 22, and partially on semiconductor body 10, i.e. making contact with semiconductor body 10.

Termination region 14 further includes a plurality of guard rings 32, 32', 32" formed in semiconductor body 16. Each guard ring 32, 32', 32" is a diffusion of a conductivity opposite to that of semiconductor body 10 as is conventionally known. Note that at least one guard ring 32 is disposed beneath first polysilicon field plate 20 under a recess 34 in field oxide 18 which is filled with polysilicon from first polysilicon field plate 20. Furthermore, a number of guard rings 32" are formed beneath respective recesses 34 in field oxide 18, which are filled with polysilicon from second polysilicon field plate 26. In addition, at least one guard ring 32' is disposed between guard ring 32 and guard rings 32" laterally beyond the inner boundary (boundary closest to active region 12) of first polysilicon field plate 20 and laterally before the outer boundary (boundary farthest from active region 12) of second polysilicon field plate 26.

The device illustrated in FIG. 1 includes a polysilicon equipotential ring 36 extending from over an edge of field oxide 18 to semiconductor body 10. Also, a diffusion 38 of a conductivity opposite to that of semiconductor body 10 is formed in semiconductor body 10 near the inner boundary of termination region 14.

FIG. 2 illustrates another power semiconductor device according to the prior art which includes a differently-shaped polysilicon equipotential ring 36.

Note that some typical dimensions are shown in the Figs. Table 1 below discloses further typical dimensions for the prior art devices shown by FIGS. 1 and 2.

TABLE 1

|        | A      | B     | C        | D        |
|--------|--------|-------|----------|----------|
| FIG. 1 | 25 μm  | 5 μm  | 19.6 μm  | 20.6 μm  |
| FIG. 2 | 25 μm  | 8 μm  | 19.6 μm  | 20.6 μm  |

A=Spacing from ring 36 to polysilicon field plate 20
B=Width of ring 36 on oxide 18
C=Spacing between inner edge of metallic field plate 24 to guard ring 32
D=Spacing between inner edge of polysilicon field plate 20 to guard ring 32.

The prior art devices illustrated by FIGS. 1 and 2 have exhibited high failure rates. It is desirable to improve the prior art devices.

SUMMARY OF THE INVENTION

In a device according to the first embodiment, the first metallic field plate is extended beyond the outer boundary of the first polysilicon field plate.

In a device according to the second embodiment, the polysilicon equipotential ring is disposed within a trench.

In a device according to the third embodiment, the first metallic field plate is extended beyond the outer boundary of the first polysilicon field plate, and the polysilicon equipotential ring is disposed within a trench.

With these changes to the prior art, improvements in the failure rate have been observed.

Other features and advantages of the present invention will become apparent from the following description of the invention which refers to the accompanying drawings.

DETAILED DESCRIPTION OF EMBODIMENTS OF THE INVENTION

Figure 3:
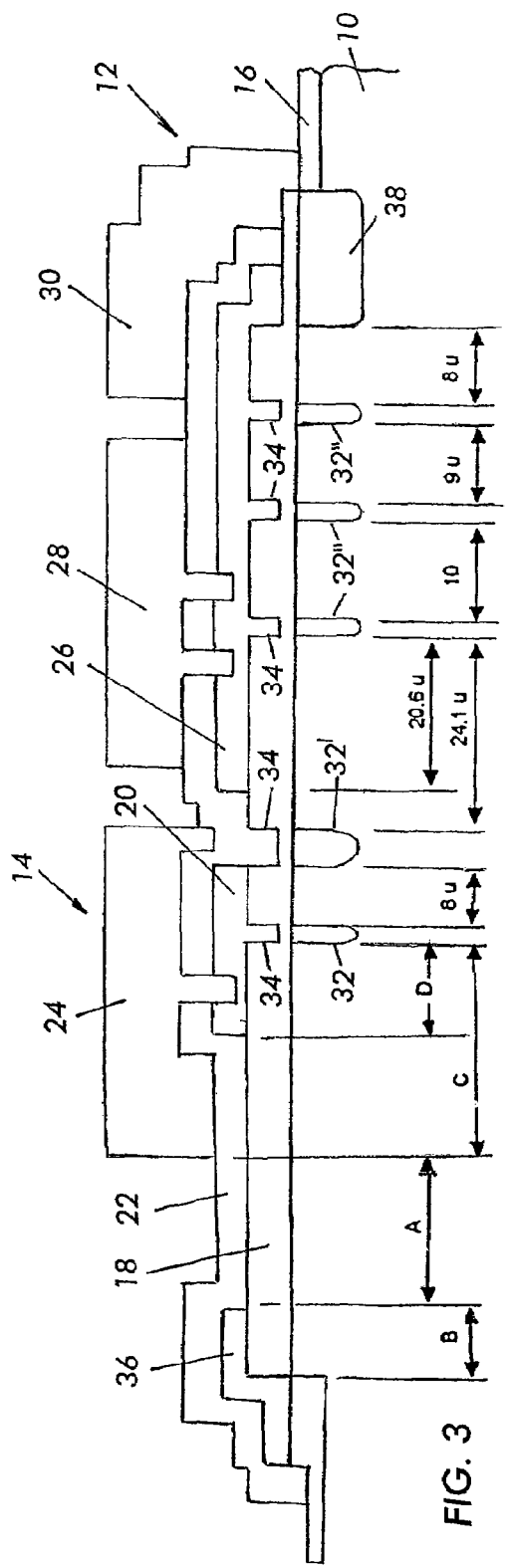
FIG. 3 schematically shows a cross-sectional view of a device according to the first embodiment of the present invention.

Referring to FIG. 3, a power semiconductor device according to the first embodiment of the present invention includes a semiconductor body having an active region 12 and a termination region 14.

Active region 12 preferably includes the active cells of a power semiconductor device, such as a power MOSFET, which may include at least one PN junction. The PN junction, for example, is a portion of semiconductor body 10 (e.g. epitaxially grown silicon) that includes a base region 16 formed therein. Base region 16 is, as is well known, a diffused region of a conductivity opposite to that of semiconductor body 10. Thus, base region 16 may be P-type when semiconductor body is N-type and vice versa.

Termination region 14 surrounds active region 12, and includes field oxide body 18 formed on semiconductor body 10, first polysilicon field plate 20, oxide body 22, first metallic field plate 24 formed on oxide body 22 and extending therethrough to make electrical contact with first polysilicon field plate 20, second polysilicon field plate 26 formed over field oxide 18 and laterally spaced from first polysilicon field plate 20, second metallic field plate 28 laterally spaced from first metallic field plate 24 formed on oxide body 22 and extending therethrough to make electrical contact with second polysilicon field plate 26 formed over field oxide 18, and third metallic field plate 30 disposed partially on oxide body 22, and partially on semiconductor body 10, i.e. making contact with semiconductor body 10.

Termination region 14 further includes a plurality of guard rings 32, 32', 32" formed in semiconductor body 10. Each guard ring 32, 32', 32" is a diffusion of a conductivity opposite to that of semiconductor body 10 as is conventionally known. Note that at least one guard ring 32 is disposed beneath first polysilicon field plate 20 under a recess 34 in field oxide 18 which is filled with polysilicon from first polysilicon field plate 20. Furthermore, a number of guard rings 32" are formed beneath respective recesses 34 in field oxide 18, which are filled with polysilicon from second polysilicon field plate 26. In addition, at least one guard ring 32' is disposed between guard ring 32 and guard rings 32" laterally beyond the inner boundary of first polysilicon field plate 20 and laterally before the outer boundary of second polysilicon field plate 26.

The device illustrated in FIG. 3 includes a polysilicon equipotential ring 36 extending from over an edge of field oxide 18 to semiconductor body 10. Also, a diffusion 38 of a conductivity opposite to that of semiconductor body 10 is formed in semiconductor body 10 near the inner edge of termination region 14.

In a device according to the first embodiment of the present invention, first metallic field plate 24 is extended over beyond the outer boundary (the boundary farthest from active region 12) of first polysilicon field plate 20 and spread over insulation body 22. It has been found that such a feature improves the reliability of the device.

Figure 4:
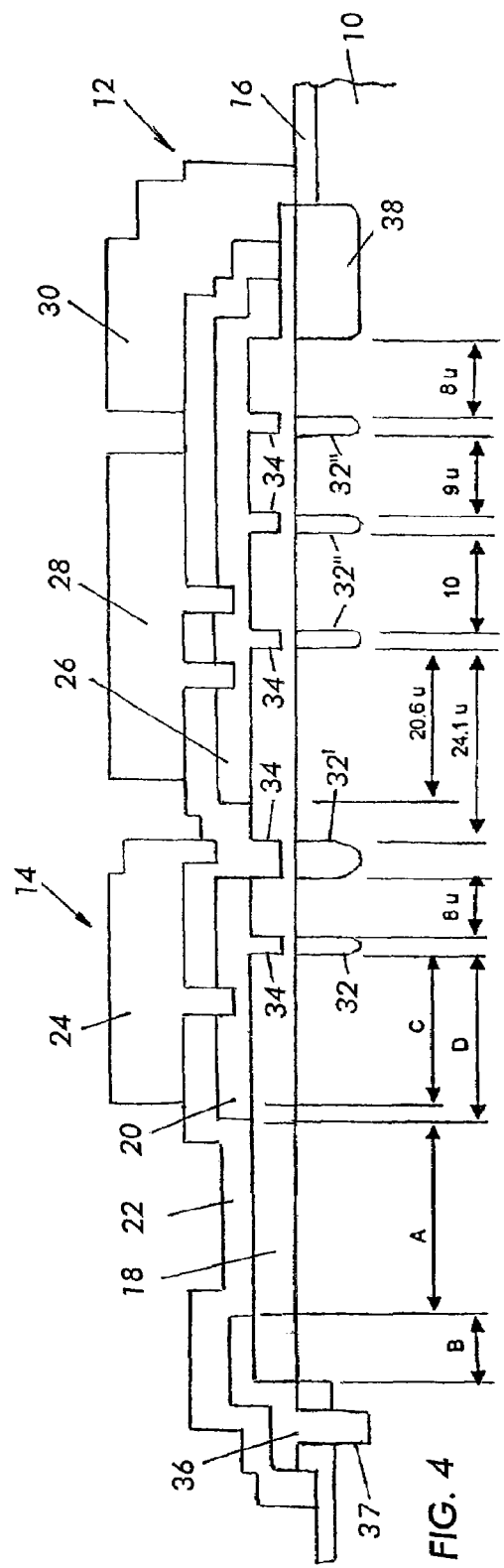
FIG. 4 schematically shows a cross-sectional view of a device according to the second embodiment of the present invention.

Referring to FIG. 4, a power semiconductor device according to the second embodiment of the present invention includes a semiconductor body having an active region 12 and a termination region 14.

Active region 12 preferably includes the active cells of a power semiconductor device, such as a power MOSFET, which may include at least one PN junction. The PN junction, for example, is a portion of semiconductor body 10 (e.g. epitaxially grown silicon) that includes a base region 16 formed therein. Base region 16 is, as is well known, a diffused region of a conductivity opposite to that of semiconductor body 10. Thus, base region 16 may be P-type when semiconductor body is N-type and vice versa.

Termination region 14 surrounds active region 12, and includes field oxide body 18 formed on semiconductor body 10, first polysilicon field plate 20, oxide body 22, first metallic field plate 24 formed on oxide body 22 and extending therethrough to make electrical contact with first polysilicon field plate 20, second polysilicon field plate 26 formed over field oxide 18 and laterally spaced from first polysilicon field plate 20, second metallic field plate 28 laterally spaced from first metallic field plate 24 formed on oxide body 22 and extending therethrough to make electrical contact with second polysilicon field plate 26 formed over field oxide 18, and third metallic field plate 30 disposed partially on oxide body 22, and partially on semiconductor body 10, i.e. making contact with semiconductor body 10.

Termination region 14 further includes a plurality of guard rings 32, 32', 32" formed in semiconductor body 10. Each guard ring 32, 32', 32" is a diffusion of a conductivity opposite to that of semiconductor body 10 as is conventionally known. Note that at least one guard ring 32 is disposed beneath first polysilicon field plate 20 under a recess 34 in field oxide 18 which is filled with polysilicon from first polysilicon field plate 20. Furthermore, a number of guard rings 32" are formed beneath respective recesses 34 in field oxide 18, which are filled with polysilicon from second polysilicon field plate 26. In addition, at least one guard ring 32' is disposed between guard ring 32 and guard rings 32" laterally beyond the inner boundary of first polysilicon field plate 20 and laterally before the outer boundary of second polysilicon field plate 26. A diffusion 38 of a conductivity opposite to that of semiconductor body 10 is formed in semiconductor body 10 near the edge of termination region 14.

A device according to the second embodiment of the present invention includes a polysilicon equipotential ring 36 extending from over an edge of field oxide 18 into an insulated trench 37, which extends into semiconductor body 10. It has been found that this feature further improves the reliability of the device.

Figure 5:
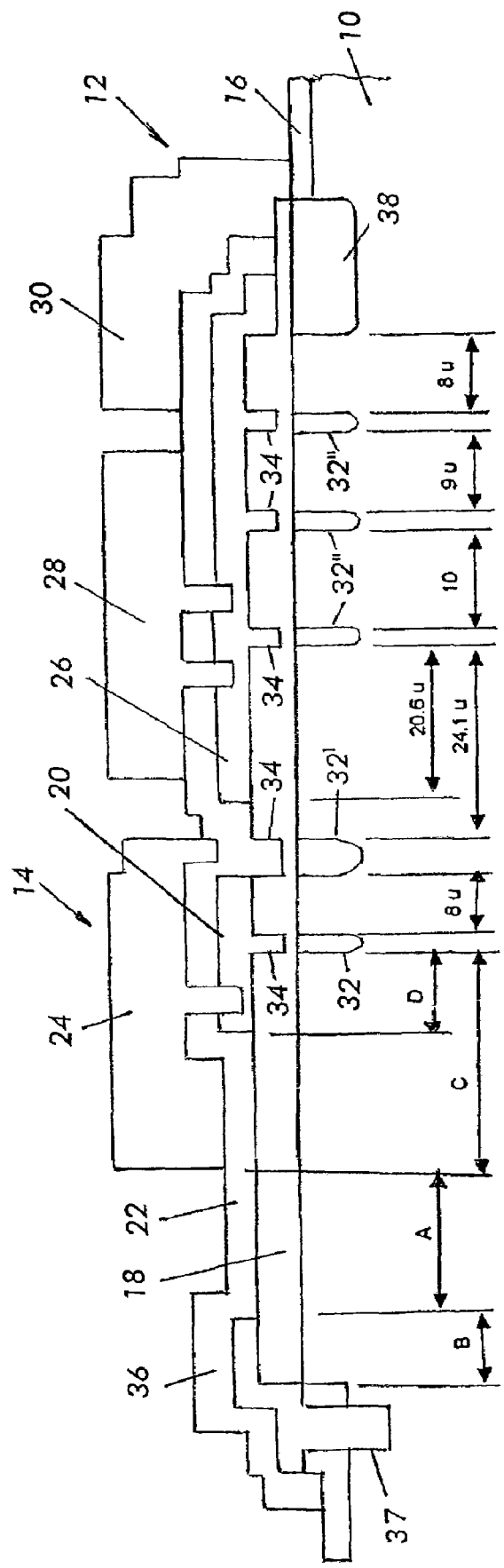
FIG. 5 schematically shows a cross-sectional view of a device according to the third embodiment of the present invention.

Referring to FIG. 5, a power semiconductor device according to the third embodiment of the present invention includes a semiconductor body having an active region 12 and a termination region 14.

Active region 12 preferably includes the active cells of a power semiconductor device, such as a power MOSFET, which may include at least one PN junction. The PN junction, for example, is a portion of semiconductor body 10 (e.g. epitaxially grown silicon) that includes a base region 16 formed therein. Base region 16 is, as is well known, a diffused region of a conductivity opposite to that of semiconductor body 10. Thus, base region 16 may be P-type when semiconductor body is N-type and vice versa.

Termination region 14 surrounds active region 12, and includes field oxide body 18 formed on semiconductor body 10, first polysilicon field plate 20, oxide body 22, first metallic field plate 24 formed on oxide body 22 and extending therethrough to make electrical contact with first polysilicon field plate 20, second polysilicon field plate 26 formed over field oxide 18 and laterally spaced from first polysilicon field plate 20, second metallic field plate 28 laterally spaced from first metallic field plate 24 formed on oxide body 22 and extending therethrough to make electrical contact with second polysilicon field plate 26 formed over field oxide 18, and third metallic field plate 30 disposed partially on oxide body 22, and partially on semiconductor body 10, i.e. making contact with semiconductor body 10.

Termination region 14 further includes a plurality of guard rings 32, 32', 32" formed in semiconductor body 10. Each guard ring 32, 32', 32" is a diffusion of a conductivity opposite to that of semiconductor body 10 as is conventionally known. Note that at least one guard ring 32 is disposed beneath first polysilicon field plate 20 under a recess 34 in field oxide 18 which is filled with polysilicon from first polysilicon field plate 20. Furthermore, a number of guard rings 32" are formed beneath respective recesses 34 in field oxide 18, which are filled with polysilicon from second polysilicon field plate 26. In addition, at least one guard ring 32' is disposed between guard ring 32 and guard rings 32" laterally beyond the inner boundary of first polysilicon field plate 20 and laterally before the outer boundary of second polysilicon field plate 26. A diffusion 38 of a conductivity opposite to that of semiconductor body 10 is formed in semiconductor body 10 near the edge of termination region 14.

In a device according to the third embodiment of the present invention, first metallic field plate 24 is extended over beyond the outer boundary (the boundary farthest from active region 12) of first polysilicon field plate 20 and spread over insulation body 22. A device according to the third embodiment of the present invention further includes a polysilicon equipotential ring 36 extending from over an edge of field oxide 18 into an insulated trench 37, which preferably extends into semiconductor body 10. It has been found that these features together improve the reliability of the device significantly.

Note that some typical dimensions are shown in FIGS. 3-5. Table 2 below discloses further typical dimensions for devices according to the present invention as schematically illustrated by FIGS. 3, 4, and 5.

TABLE 2

Figure 1:
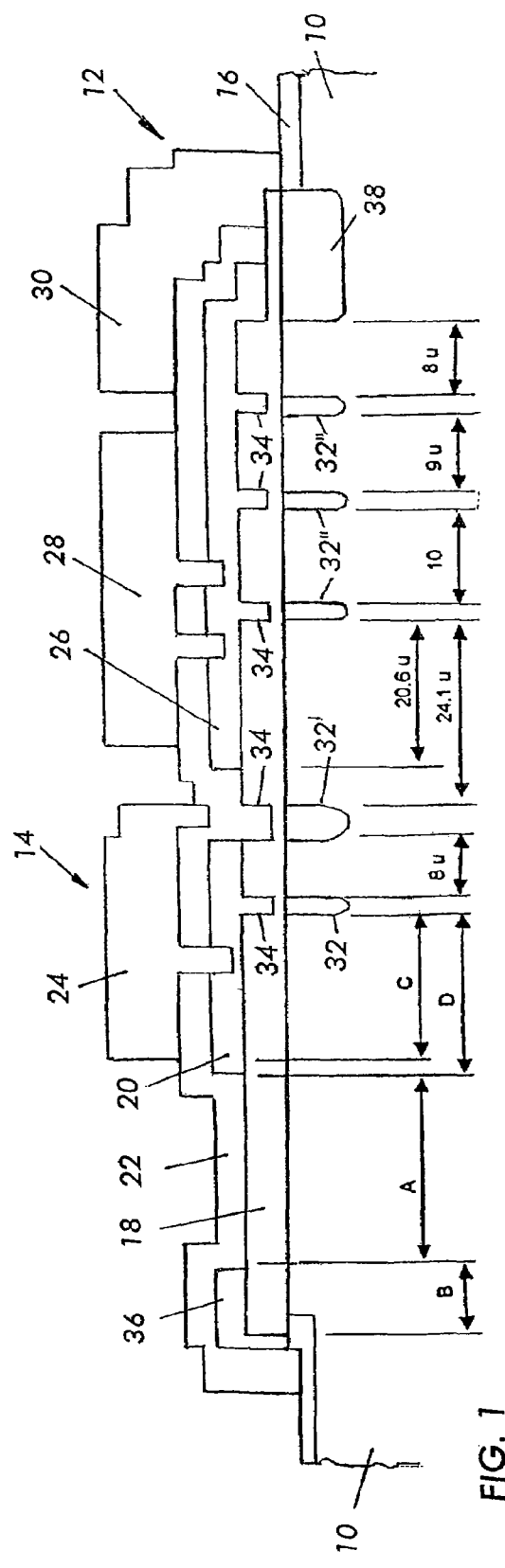
FIG. 1 schematically shows a cross-sectional view of a prior art device.
Figure 2:
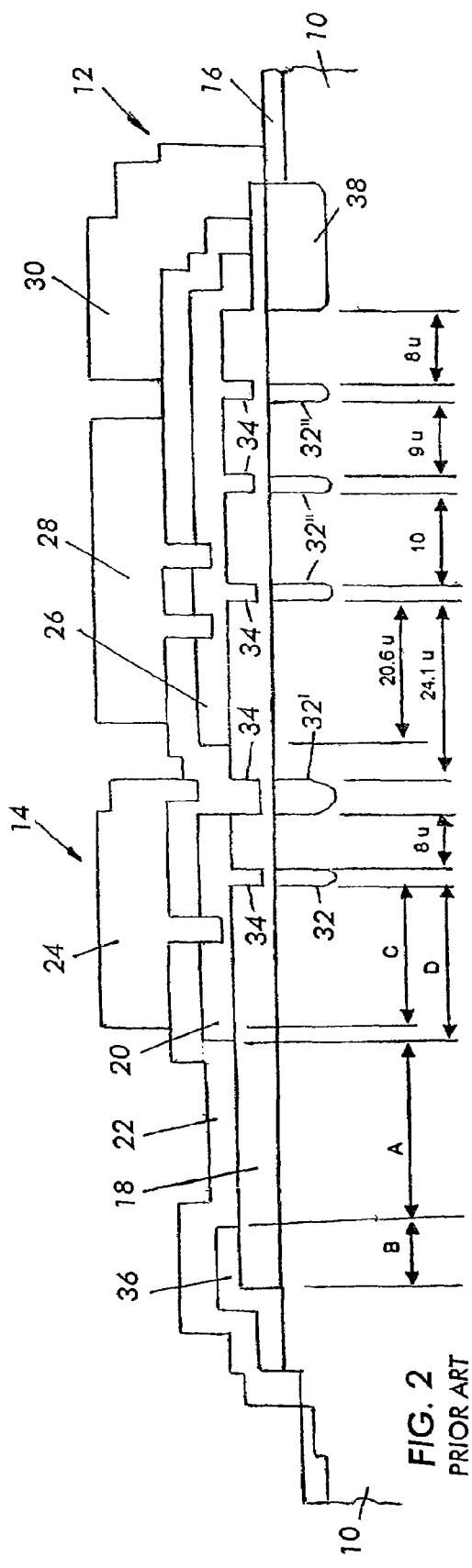
FIG. 2 schematically shows a cross-sectional view of a prior art device.

|  | A | B | C | D |
| --- | --- | --- | --- | --- |
| FIG. 1 | 15 μm | 8 μm | 26.6 μm | 10.6 μm |
| FIG. 2 | 25 μm | 8 μm | 19.6 μm | 20.6 μm |
| FIG. 5 | 15 μm | 8 μm | 26.6 μm | 10.6 μm |

A=Spacing from ring 36 to metal field plate 24 in FIGS. 3 and 5, and polysilicon field plate 20 in FIG. 4

B=Width of ring 36 on oxide 18

C=Spacing between inner edge of metallic field plate 24 to guard ring 32

D=Spacing between inner edge of polysilicon field plate 20 to guard ring 32.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A power semiconductor device comprising:
   a semiconductor body that includes an active region, said active region including a PN junction; and a termination region disposed around said active region, said termination region including, a field insulation body formed over said semiconductor body; a polysilicon field plate formed over said field insulation body and spanning continuously between an inner boundary and an outer boundary, said inner boundary being closer to said active region than said outer boundary, a region of said polysilicon field plate that is closest to said active region and said outer boundary being a region of said polysilicon field plate that is farthest from said active region; an insulation body disposed over said polysilicon field plate; a metallic field plate through said insulation body and electrically connected with said polysilicon field plate through said insulation body; wherein said metallic field plate is spread over said insulation body and extends beyond said outer boundary of said polysilicon field plate.

2. The power semiconductor device of claim 1, further comprising an equipotential ring.

3. The power semiconductor device of claim 2, wherein said equipotential ring is comprised of polysilicon.

4. The power semiconductor device of claim 2, wherein said equipotential ring is comprised of polysilicon and disposed inside an insulated trench which extends into said semiconductor body.

5. The power semiconductor device of claim 1, further comprising at least one guard ring of conductivity opposite to that of said semiconductor body formed inside said semiconductor body under said polysilicon plate.

6. The power semiconductor device of claim 5, wherein said polysilicon field plate is received inside a recess in said field insulation.

7. The power semiconductor device of claim 5, further comprising a plurality of spaced guard rings of a conductivity opposite to that of said semiconductor body formed in said semiconductor body under said field insulation, another polysilicon field plate formed on said field insulation over said plurality of spaced guard rings; and another metallic field plate disposed over said insulation body and electrically connected to said another polysilicon field plate through said insulation body.

8. The power semiconductor device of claim 7, further comprising at least another guard ring of a conductivity opposite that of said semiconductor body formed in said semiconductor body under said field insulation and disposed between said at least one guard ring and said plurality of spaced field rings, wherein said at least another guard ring is disposed laterally beyond an inner boundary of said polysilicon field plate, and laterally before the outer boundary of said another polysilicon field plate.

9. A power semiconductor device comprising:
   a semiconductor body that includes an active region, said active region including a PN junction; and a termination region disposed around said active region, said termination region including, a field insulation body formed over said semiconductor body; a polysilicon field plate formed over said field insulation body spanning continuously between an inner boundary and an outer boundary, said inner boundary being closer to said active region than said outer boundary, said inner boundary being a region of said polysilicon field plate that is closest to said active region and said outer boundary being a region of said polysilicon field plate that is farthest from said active region; an insulation body disposed over said polysilicon field plate; a metallic field plate disposed over said insulation body and electrically connected with said polysilicon field plate through said insulation body; an equipotential ring, wherein said equipotential ring is comprised of polysilicon and disposed inside an insulated trench which extends into said semiconductor body.

10. The power semiconductor device of claim 9, wherein said metallic field plate is spread over said insulation body and extends beyond said outer boundary of said polysilicon field plate.

11. The power semiconductor device of claim 9, further comprising at least one guard ring of a conductivity opposite to that of said semiconductor body formed inside said semiconductor body under said polysilicon field plate.

12. The power semiconductor device of claim 11, wherein said polysilicon field plate is received inside a recess in said field insulation.

13. The power semiconductor device of claim 11, further comprising a plurality of spaced guard rings of a conductivity opposite to that of said semiconductor body formed in said semiconductor body under said field insulation, another polysilicon field plate formed on said field insulation over said plurality of spaced guard rings; and another metallic field plate disposed over said insulation body and electrically connected to said another polysilicon field plate through said insulation body.

14. The power semiconductor device of claim 13, further comprising at least another guard ring of a conductivity opposite that of said semiconductor body formed in said semiconductor body under said field insulation and disposed between said at least one guard ring and said plurality of spaced field rings, wherein said at least another guard ring is disposed laterally beyond an inner boundary of said polysilicon field plate, and laterally before the outer boundary of said another polysilicon field plate.

15. A power semiconductor device comprising:
a semiconductor body that includes an active region, said active region including a PN junction; and a termination region disposed around said active region, said termination region including, a field insulation body formed over said semiconductor body; a polysilicon field plate formed over said field insulation body and spanning continuously between an inner boundary and an outer boundary, said inner boundary being closer to said active region than said outer boundary, said inner boundary being a region of said polysilicon field plate that is closest to said active region and said outer boundary being a region of said polysilicon field plate that is farthest from said active region; an insulation body disposed over said polysilicon field plate; a metallic field plate disposed over said insulation body and electrically connected with said polysilicon field plate through said insulation body; wherein said metallic field plate does not completely cover said insulation body and extends beyond said outer boundary of said polysilicon field plate.

16. The power semiconductor device of claim 15, further comprising an equipotential ring.

17. The power semiconductor device of claim 16, wherein said equipotential ring is comprised of polysilicon.

18. The power semiconductor device of claim 16, wherein said equipotential ring is comprised of polysilicon and disposed inside an insulated trench which extends into said semiconductor body.

19. The power semiconductor device of claim 15, further comprising at least one guard ring of conductivity opposite to that of said semiconductor body formed inside said semiconductor body under said polysilicon plate.

20. The power semiconductor device of claim 19, wherein said polysilicon field plate is received inside a recess in said field insulation.

* * * * *

UNITED STATES PATENT AND TRADEMARK OFFICE
CERTIFICATE OF CORRECTION

| | | |
|---|---|---|
| PATENT NO. | : 7,679,111 B2 | Page 1 of 1 |
| APPLICATION NO. | : 11/521100 | |
| DATED | : March 16, 2010 | |
| INVENTOR(S) | : Cao et al. | |

It is certified that error appears in the above-identified patent and that said Letters Patent is hereby corrected as shown below:

In the claims, column 5, line 58, "through" should be changed to --disposed over--.

Signed and Sealed this
Twenty-second Day of November, 2011

David J. Kappos
*Director of the United States Patent and Trademark Office*